(12) United States Patent
Du et al.

(10) Patent No.: US 11,590,732 B2
(45) Date of Patent: Feb. 28, 2023

(54) DISPLAY DEVICE AND OPTICALLY CLEAR ADHESIVE

(71) Applicant: BOE Technology Group Co., Ltd., Beijing (CN)

(72) Inventors: Shuang Du, Beijing (CN); Paoming Tsai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 319 days.

(21) Appl. No.: 16/834,627

(22) Filed: Mar. 30, 2020

(65) Prior Publication Data
US 2021/0031491 A1 Feb. 4, 2021

(30) Foreign Application Priority Data
Jul. 31, 2019 (CN) .......................... 201910704598.5

(51) Int. Cl.
*B32B 7/12* (2006.01)
*G06F 3/041* (2006.01)
*B32B 7/06* (2019.01)

(52) U.S. Cl.
CPC .................. *B32B 7/12* (2013.01); *B32B 7/06* (2013.01); *B32B 2307/412* (2013.01);
(Continued)

(58) Field of Classification Search
CPC ............. Y10T 428/14; Y10T 428/1476; Y10T 428/1481; Y10T 428/24942;
(Continued)

(56) References Cited

U.S. PATENT DOCUMENTS

| 6,074,729 A * | 6/2000 | Watanabe ............ G02B 5/3033 |
| | | 428/355 R |
| 2013/0050617 A1* | 2/2013 | Lee ................... G02F 1/133528 |
| | | 349/96 |

(Continued)

FOREIGN PATENT DOCUMENTS

| CN | 206768000 U | * 12/2017 |
| CN | 208240297 U | 12/2018 |

(Continued)

OTHER PUBLICATIONS

Derwent Abstract No. 2018-00789C corresponding to CN 206768000 U. (Year: 2018).*

(Continued)

*Primary Examiner* — Maria V Ewald
*Assistant Examiner* — Ethan A. Utt
(74) *Attorney, Agent, or Firm* — ArentFox Schiff LLP; Michael Fainberg

(57) ABSTRACT

The present disclosure discloses an optical clear adhesive and a display device. The display device includes: a flexible display panel having at least one foldable area; and an optical clear adhesive disposed on at least one side of the flexible display panel. The optical clear adhesive includes: a substrate layer, a first adhesive material structure and a second adhesive material structure disposed on two opposite sides of the substrate layer, all of which are transparent materials; a deformation recovery rate of the substrate layer is greater than that of each of the first adhesive material structure and the second adhesive material structure; and in the optical clear adhesive, the first adhesive material structure is closer to an inner folding side of the foldable area of a display panel, and the second adhesive material structure is closer to an outer folding side of the foldable area of the display panel.

16 Claims, 3 Drawing Sheets

(52) U.S. Cl.
CPC ... *B32B 2307/546* (2013.01); *B32B 2307/732* (2013.01); *B32B 2457/208* (2013.01); *G06F 3/041* (2013.01); *G06F 2203/04102* (2013.01)

(58) Field of Classification Search
CPC ....... Y10T 428/2495; Y10T 428/24959; Y10T 428/24967; Y10T 428/24975; Y10T 428/24983; Y10T 428/24992; Y10T 428/26; Y10T 428/266; Y10T 428/269; Y10T 428/27; Y10T 428/273; Y10T 428/28; Y10T 428/2809; Y10T 428/2839; Y10T 428/2848; Y10T 428/2852; Y10T 428/287; Y10T 428/2878; Y10T 428/2883; Y10T 428/2891; Y10T 428/2896; Y10T 428/31507; Y10T 428/31511; Y10T 428/31515; Y10T 428/31518; Y10T 428/31525; Y10T 428/31551; Y10T 428/31554; Y10T 428/31565; Y10T 428/31573; Y10T 428/31587; Y10T 428/31598; Y10T 428/31601; Y10T 428/31616; Y10T 428/31623; Y10T 428/31645; Y10T 428/31649; Y10T 428/31721; Y10T 428/31786; Y10T 428/31797; Y10T 428/31855; Y10T 428/31909; Y10T 428/31913; Y10T 428/31917; Y10T 428/3192; Y10T 428/31924; Y10T 428/31928; Y10T 428/31931; Y10T 428/31935; Y10T 428/31938; B32B 7/00; B32B 7/02; B32B 7/022; B32B 7/023; B32B 7/04; B32B 7/12; B32B 17/00; B32B 17/06; B32B 17/10; B32B 27/00; B32B 27/06; B32B 27/08; B32B 27/28; B32B 27/281; B32B 27/283; B32B 27/30; B32B 27/302; B32B 27/308; B32B 27/32; B32B 27/36; B32B 27/365; B32B 27/38; B32B 27/40; B32B 2307/40; B32B 2307/412; B32B 2307/42; B32B 2307/50; B32B 2307/51; B32B 2307/536; B32B 2457/20; B32B 2457/202; B32B 2457/204; B32B 2457/206; B32B 2457/208; C09J 7/00; C09J 7/20; C09J 7/201; C09J 7/22; C09J 7/24; C09J 7/241; C09J 7/243; C09J 7/25; C09J 7/255; C09J 7/29; C09J 7/30; C09J 7/38; C09J 7/381; C09J 7/383; C09J 7/385; C09J 7/387; C09J 7/40; C09J 7/401; C09J 133/00; C09J 133/04; C09J 133/06; C09J 133/08; C09J 133/10; C09J 133/12; C09J 2203/318; C09J 2301/00; C09J 2301/10; C09J 2301/12; C09J 2301/124; C09J 2301/1242; C09J 2301/16; C09J 2301/162; C09J 2301/20; C09J 2301/208; C09J 2301/30; C09J 2301/302; C09J 2301/312; G02B 1/00; G02B 1/04; G02B 1/08; G02B 1/10; G02F 1/00; G02F 1/0009; G02F 1/0063; G02F 1/0072; G02F 1/01
USPC .... 428/40.1, 41.8, 41.9, 212–220, 332, 337, 428/339–341, 343, 345, 352, 354, 355 R, 428/355 EP, 355 EN, 355 AC, 355 N, 428/412, 413, 414, 415, 417, 423.1, 428/423.3, 423.7, 424.2, 424.8, 425.5, 428/425.6, 426, 428, 429, 430, 435, 441, 428/442, 446, 447, 448, 451, 473.5, 480, 428/483, 500, 515, 516, 517, 519, 520, 428/521, 522, 523, 355 BL
See application file for complete search history.

(56) References Cited

U.S. PATENT DOCUMENTS

| | | | |
|---|---|---|---|
| 2016/0122599 A1 | 5/2016 | Kim et al. | |
| 2017/0162823 A1* | 6/2017 | Kim | H01L 51/0097 |
| 2017/0306193 A1* | 10/2017 | Moon | C09J 133/08 |
| 2018/0201002 A1* | 7/2018 | Kim | C08J 7/0427 |
| 2019/0392737 A1 | 12/2019 | Du et al. | |

FOREIGN PATENT DOCUMENTS

| | | | | |
|---|---|---|---|---|
| EP | 3473688 A1 | | 4/2019 | |
| KR | 20150105041 A | * | 9/2015 | ............ C09J 133/04 |
| KR | 20160070226 A | * | 6/2016 | ............ H01L 27/32 |
| WO | WO-2014130507 A1 | * | 8/2014 | ................ C09J 7/00 |

OTHER PUBLICATIONS

Machine translation (Espacenet) of KR 2015-0105041 A. Translated Oct. 22, 2022. (Year: 2022).*

Machine translation (Espacenet) of KR 2016-0070226 A. Translated Oct. 22, 2022. (Year: 2022).*

Office Action for corresponding Chinese Application 201910704598.5 dated Feb. 7, 2021.

* cited by examiner

US 11,590,732 B2

DISPLAY DEVICE AND OPTICALLY CLEAR ADHESIVE

CROSS REFERENCE TO RELATED APPLICATION

This application claims priority to Chinese Patent Application No. 201910704598.5, filed with the Chinese Patent Office on Jul. 31, 2019. The entire disclosure of the above application is incorporated herein by reference.

FIELD

The present disclosure relates to the technical field of display and in particular to a display device and an optical clear adhesive.

BACKGROUND

With the development of a display technology, the demand of display devices with different forms grows. Bendable or foldable display devices have been developed. A flexible display device generally includes various external components such as a flexible display panel and a touch screen.

The flexible panel and the external components may generate deformation difficult to recover when being bent for a long time so as to affect the service reliability of the flexible display device.

SUMMARY

The present disclosure discloses a display device and an optical clear adhesive. On the first aspect, embodiments of the disclosure provide a flexible display panel, including: at least one plane area and at least one foldable area. The flexible display panel has two opposite sides, and an optical clear adhesive disposed on at least one of the two opposite sides of the flexible display panel. The optical clear adhesive includes: a substrate layer, a first adhesive material structure and a second adhesive material structure respectively disposed on two opposite sides of the substrate layer; and all the substrate layer, the first adhesive material structure and the second adhesive material structure are transparent materials; a deformation recovery rate of the substrate layer is greater than that of each of the first adhesive material structure and the second adhesive material structure; and in the optical clear adhesive, the first adhesive material structure is closer to an inner folding side of the foldable area of a display panel, and the second adhesive material structure is closer to an outer folding side of the foldable area of the display panel.

On the second aspect, the present disclosure provides an optical clear adhesive including a substrate layer, a first adhesive material structure and a second adhesive material structure respectively disposed on two opposite sides of the substrate layer. All the substrate layer, the first adhesive material structure and the second adhesive material structure are transparent materials; and the deformation recovery rate of the substrate layer is greater than that of each of the first adhesive material structure and the second adhesive material structure.

DETAILED DESCRIPTION OF THE EMBODIMENTS

The technical solutions in the embodiments of the present disclosure will be described clearly and completely below in conjunction with accompanying drawings in the embodiments of the present disclosure. Obviously, the described embodiments are a part of the embodiments of the present disclosure, not all the embodiments. Based on the embodiments of the present disclosure, all other embodiments obtained by those of ordinary skill in the art without creative work shall fall within the protection scope of the present disclosure.

Based on the purposes of improving the bending performance of a flexible display device and improving the service reliability of the flexible display device, the present disclosure provides the following technical solutions.

Figure 1:
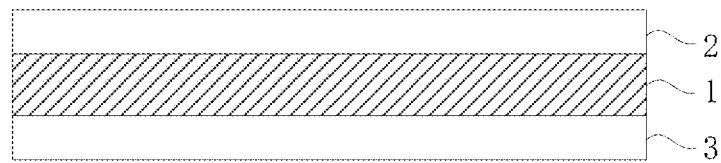
FIG. 1 is a schematic structural diagram of an optical clear adhesive provided by an embodiment of the present disclosure.
Figure 2:
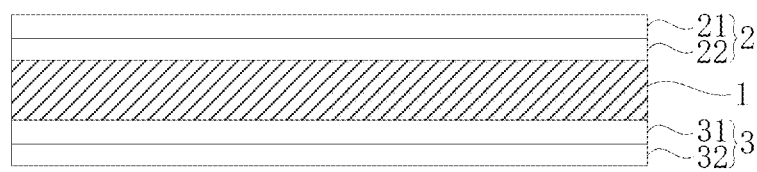
FIG. 2 is a schematic structural diagram of an optical clear adhesive provided by another embodiment of the present disclosure.
Figure 3:
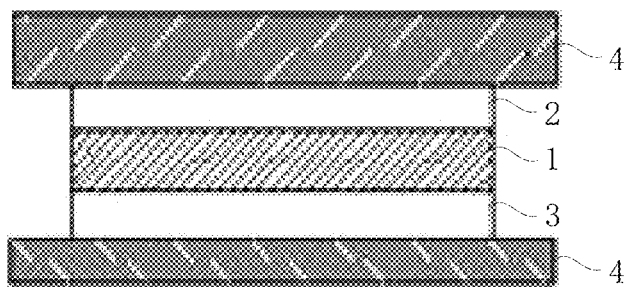
FIG. 3 is a schematic structural diagram of an optical clear adhesive provided by another embodiment of the present disclosure.

As shown in FIG. 1 to FIG. 3, an embodiment of the present disclosure provides an optical clear adhesive including a substrate layer 1, a first adhesive material structure 2 and a second adhesive material structure 3 respectively disposed on two opposite sides of the substrate layer 1, and all the substrate layer 1, the first adhesive material structure 2 and the second adhesive material structure 3 are transparent materials; and the deformation recovery rate of the substrate layer 1 is greater than that of each of the first adhesive material structure 2 and the second adhesive material structure 3.

The above-mentioned optical clear adhesive includes the three parts of structures including the substrate layer 1, the first adhesive material structure 2 and the second adhesive material structure 3, the substrate layer 1 is disposed between the first adhesive material structure 2 and the second adhesive material structure 3 and has a greater deformation recovery rate so as to be capable of effectively enhancing the deformation recovery performance of the optical clear adhesive. Furthermore, when the optical clear adhesive is applied to a folding display device, the deformation recovery performance after the overall folding display device is bent may be effectively improved, the buckling phenomenon of a bending area, caused when the folding display device is folded and unfolded, may be reduced, and the service reliability of the flexible display device may be improved.

In some embodiments, the deformation recovery rate of the second adhesive material structure 3 is greater than that of the first adhesive material structure 2. The deformation recovery rate is generally defined as a ratio of a difference of a deformation quantity under the action of set stress and a residual deformation quantity obtained after stress removal to the deformation quantity under the action of the set stress.

The transparent materials are generally defined as that the light transmittance of visible light with the wavelength being 400-800 nm is higher than 80%.

In a process that the flexible display device is folded and unfolded, the strain of the optical clear adhesive is generated by any stress of pressure stress or tensile stress, the strains at an inner bending side and an outer bending side of the optical clear adhesive are different, and therefore, due to the arrangement of the second adhesive material structure 3 with the greater deformation recovery rate at the inner bending side, the elastic resilience of the optical clear adhesive may be effectively enhanced, and the folds and buckling problems generated in a bending process may be reduced.

Exemplarily, the deformation recovery rate of the first adhesive material structure 2 is greater than 80%; the deformation recovery rate of the second adhesive material structure 3 is greater than 90%; and the deformation recovery rate of the substrate layer 1 is greater than 95%.

In some embodiments, the storage modulus of the second adhesive material structure 3 is greater than that of the first adhesive material structure 2.

Exemplarily, the storage modulus of the first adhesive material structure 2 is 20 KPa-50 KPa; and the storage modulus of the second adhesive material structure 3 is 50 KPa-100 KPa.

Exemplarily, the storage modulus of the first adhesive material structure 2 is 20 KPa-50 KPa (@1 HZ@25° C.), where @1 HZ@25° C. represents for environmental conditions that the load frequency is 1 HZ and the temperature is 25° C.; further, the storage modulus of the first adhesive material structure 2 may be specifically 30 KPa-50 KPa (@1 HZ@25° C.), and the storage modulus at high temperature is greater than or equal to 20 KPa such as 20 KPa (@1 HZ@60° C.). The storage modulus of the second adhesive material structure 3 is 50 KPa-100 KPa (@1 HZ@25° C.) and is specifically 60-80 KPa (@1 HZ@25° C.).

The storage modulus of the second adhesive material structure 3 is greater than that of the first adhesive material structure 2, so that the second adhesive material structure 3 may have better deformation resilience, and the first adhesive material structure 2 may have better tensile properties. Due to the arrangement of the second adhesive material structure 3 with the better deformation resilience at the inner bending side, the elastic resilience of the optical clear adhesive may be enhanced, and folds generated in the bending process may be reduced; due to the arrangement of the first adhesive material structure 2 with the better tensile properties at an outer bending side, a certain tensile deformation may be provided to reduce bending stress and improve the bending deformability of the optical clear adhesive; and furthermore, due to the arrangement of the storage modulus of each of the above-mentioned first adhesive material structure 2 and second adhesive material structure 3, the bending performance of the flexible display panel may be improved from various aspects.

In addition, due to the arrangement of the storage modulus of each of the above-mentioned first adhesive material structure 2 and second adhesive material structure 3, the problem that air bubbles appear in the optical clear adhesive due to gases generated by a polymer material in a high-temperature process may also be avoided.

In some embodiments, as shown in FIG. 1, each of the first adhesive material structure 2 and the second adhesive material structure 3 may include one adhesive material layer; namely the optical clear adhesive in the embodiment of the present disclosure may be composed of three layers of structures.

In some embodiments, as shown in FIG. 2, the first adhesive material structure 2 and/or the second adhesive material structure 3 may also include a plurality of adhesive material layers.

Exemplarily, the first adhesive material structure 2 includes at least two adhesive material layers, and the closer the adhesive material layer is to the substrate layer 1, the greater the storage modulus of the adhesive material layer is; and/or the second adhesive material structure 3 includes at least two adhesive material layers, and the closer the adhesive material layer is to the substrate layer 1, the greater the storage modulus of the adhesive material layer is.

In some embodiments, the storage modulus of each adhesive material layer in the first adhesive material structure 2 is greater than that of each adhesive material layer in the second adhesive material structure 3.

In other words, when the first adhesive material structure 2 and/or the second adhesive material structure 3 includes the plurality of adhesive material layers, the storage modulus of the adhesive material layer close to the inner bending side is greater than that of the adhesive material layer close to the outer bending side, so that the optical clear adhesive may simultaneously have better bending deformability and elastic resilience.

Exemplarily, as shown in FIG. 2, each of the first adhesive material structure 2 and the second adhesive material structure 3 may include two adhesive material layers, namely the optical clear adhesive in the embodiment of the present disclosure is composed of five layers of structures, where the first adhesive material structure 2 includes a first adhesive material layer 21 and a second adhesive material layer 22, and the second adhesive material structure 3 includes a third adhesive material layer 31 and a fourth adhesive material layer 32, where the second adhesive material layer 22 and the third adhesive material layer 31 are adjacent to the substrate layer 1 respectively.

Table 1 provides a specific parameter setting of the five layers of structures in the optical clear adhesive in the present embodiment, specifically including the maximum stress and deformation recovery rate (Recovery) of each layer of structure under the condition of a set strain rate (Strain), wherein @85° C. 2.5% Strain represents for the condition of 2.5% of strain rate (Strain) at 85° C. It may be seen from data in the table, the deformation recovery rates of the first adhesive material layer to the fourth adhesive material layer are gradually increased, and the elastic resilience of the first adhesive material layer to the fourth adhesive material layer is gradually improved; the maximum stresses of the fourth adhesive material layer to the first adhesive material layer are gradually reduced, and the bending deformability of the fourth adhesive material layer to the first adhesive material layer is gradually improved; and furthermore, due to the arrangement of the first adhesive material layer of the optical clear adhesive close to the inner bending side of the flexible display panel and the arrangement of the fourth adhesive material layer close to the outer bending side of the flexible display panel, the role in simultaneously improving the bending deformability and the elastic resilience of the flexible display panel may be achieved.

TABLE 1

|  | Maximum stress (MPa) | Recovery |
|---|---|---|
| First adhesive material layer @85° C. 2.5% Strain | 45 | 71.4% |
| Second adhesive material layer @85° C. 2.5% Strain | 50 | 82% |
| Substrate layer 1@85° C. 2.5% strain | 120 | 95% |
| Third adhesive material layer @85° C. 2.5% Strain | 78 | 75% |
| Fourth adhesive material layer @85° C. 2.5% Strain | 90 | 87.6% |

In some embodiments, the glass transition temperatures of the first adhesive material structure 2 and the second adhesive material structure 3 are lower than 30° C. below zero; and in some other embodiments, the glass transition temperatures of the first adhesive material structure 2 and the second adhesive material structure 3 are lower than 40° C. below zero, exemplarily, the glass transition temperatures of the first adhesive material structure 2 and the second adhesive material structure 3 may be set between 40° C. below zero and 50° C. below zero or set to be lower than 50° C. below zero.

In some embodiments, the viscosities of the first adhesive material structure 2 and the second adhesive material structure 3 may be 1500-3000 gf/inch.

In some embodiments, the Young modulus of the substrate layer 1 may be 2 GPa-10 GPa; for example, during specific implementation, the Young modulus of the substrate layer 1 may be set at 3 GPa-5 GPa.

Exemplarily, the strain rate of the substrate layer 1 may be 100%-200%. The strain rate is defined as a ratio of a difference of a size obtained after tensile deformation and a size before tensile deformation to the size before tensile deformation.

In some embodiments, a material of the substrate layer 1 may include polyethylene terephthalate (PET), polyimide (PI), polyurethane (PU) and silicon (Si). For example, during specific implementation, PU or Si may be selected.

In some embodiments, the thickness of the first adhesive material structure 2 is 2 µm-30 µm, may be specifically 2 µm-25 µm and may be more specifically 2 µm-10 µm. The thickness of the second adhesive material structure 3 is 2 µm-100 µm and may be specifically 5 µm-25 µm. The thickness of the substrate layer 1 is 5 µm-100 µm and may be specifically 5 µm-50 µm.

The thicknesses of the first adhesive material structure 2 and the second adhesive material structure 3 may be different and may be specifically set according to a hydrophobic degree of a contact interface, exemplarily, the thicknesses of the first adhesive material structure 2 and the second adhesive material structure 3 may be matched according to a hydrophobic degree of a surface of a film layer required to be adhered, the stronger the hydrophobicity is, the larger the thicknesses are.

As shown in FIG. 3, in some embodiments, the optical clear adhesive may further include two release liners 4. One of the release liners 4 is disposed on the side, facing away from the substrate layer 1, of the first adhesive material structure 2, and the other release liner 4 is disposed on the side, facing away from the substrate layer 1, of the second adhesive material structure 3.

Exemplarily, the two release liners 4 may include a heavy release liner and a light release liner.

Exemplarily, the heavy release liner may be disposed on the side, facing away from the substrate layer 1, of the first adhesive material structure 2; and the light release liner may be disposed on the side, facing away from the substrate layer 1, of the second adhesive material structure 3.

In some embodiments, an adhesive in the first adhesive material structure 2 and the second adhesive material structure 3 may contain an acrylic copolymer containing a hydroxyl group and an adhesive composition of an organic nanomaterial. The acrylic copolymer containing the hydroxyl group forms a matrix of an adhesive film and may provide adhesiveness for the adhesive film.

Exemplarily, the acrylic copolymer containing the hydroxyl group may contain acrylate containing a hydroxyl group and a co-monomer, wherein the "co-monomer" does not contain the acrylate containing the hydroxyl group.

The acrylate containing the hydroxyl group may include at least one of (methyl) acrylate containing C1-C20 alkyl with at least one hydroxyl group, (methyl) acrylate containing C5-C20 cycloalkyl with at least one hydroxyl group and (methyl) acrylate containing C6-C20 aryl with at least one hydroxyl group.

Specifically, the (methyl) acrylate containing the hydroxyl group may include, but is not limited to, at least one selected from 2-hydroxyethyl (methyl) acrylate, 4-hydroxybutyl (methyl) acrylate, 2-hydroxypropyl (methyl) acrylate, 2-hydroxybutyl (methyl) acrylate and 6-hydroxyhexyl (methyl) acrylate. Particularly, a (methyl) acrylic acid monomer containing C1-C5 alkyl groups with hydroxyl groups may further improve the adhesiveness of the adhesive film. A (methyl) acrylic acid monomer containing hydroxyl groups may exist in a polymer according to the weight being about 5 wt % to about 40 wt %, and the adhesive film formed within the range has relatively low haze and may show good adhesive strength.

The co-monomer may include, but not be limited to, at least one of an alkyl (methyl) acrylate monomer, a monomer containing ethylene oxide, a monomer containing propylene oxide, a monomer containing an amine group, a monomer containing an amide group, a monomer containing an alkoxy group, a monomer containing a phosphate group, a monomer containing a sulfonate group, a monomer containing a phenyl group and a monomer containing a silane group.

The co-monomer may further contain resin which may be one or more of polyurethane resin and one or more of epoxy polyester resin, silicone resin, polyisoprene, polycarbonate resin, polyimide resin, cycloolefin polymer resin and acrylic resin and is preferably (methyl) acrylic resin. The adhesive performances of an adhesive material to different interfaces are different, and therefore, the type and proportion of the resin may be changed according to the different interfaces in contact with the first adhesive material structure 2 and the second adhesive material structure 3.

In some embodiments, a monomer of a (methyl) acrylic copolymer containing a hydroxyl group may include: 2-ethylhexyl acrylate (EHA), 4-hydroxybutyl acrylate (HBA) and 2-hydroxyethyl acrylate (HEA). The adhesive composition may include a polymerization initiator and a crosslinking agent; the initiator is used for forming the (methyl) acrylic copolymer (through curing or polymerizing a monomer mixture) or is used for curing a viscous liquid to form a film and specifically includes a photo-polymerization initiator and a thermal polymerization initiator, and in the adhesive composition in the embodiment, the initiator is the photo-polymerization initiator and may include Irgacure651 (2,2- dimethoxy-2-phenyl acetophenone, BASF) and Irgacure184 (1-hydroxycyclohexyl phenyl ketone BASF); and the cross-linking agent may include 1,6-hexanediol diacrylate.

A preparation process of an adhesive may specifically include the following steps: 100 parts by weight of a monomer mixture containing 65 wt % of 2-ethylhexyl acrylate and 35 wt % of 4-hydroxybutyl acrylate, 4 parts by weight of organic nanoparticles and 0.005 part by weight of Irgacure651 photo-polymerization initiator are mixed to prepare a mixture; after dissolved oxygen in a glass container is replaced with nitrogen, the mixture is subjected to partial polymerization through ultraviolet (UV) light irradiation of a low-voltage lamp to prepare a mixture containing a (methyl) acrylic copolymer (prepolymer) with a hydroxyl group, a monomer and an organic nanomaterial and having the viscosity of about 2000 cPs; and an additional Irgacure184 photo-polymerization initiator is added into the prepared mixture according to the quantity of 5 parts by weight relative to 100 parts by weight of a monomer mixture so as to prepare the adhesive composition.

Exemplarily, a polyester film (release liner, polyethylene terephthalate film, thickness: 75 μm) may be coated with the prepared adhesive composition to form an adhesive material layer with the thickness of 50 μm. Two sides of the adhesive material layer are irradiated for about 6 min by UV light irradiation of the low-voltage lamp by virtue of the release liner arranged on the surface of the adhesive material layer, and thus, a transparent adhesive material layer is obtained. The adhesive material layer may also be formed by curing such as thermal curing, curing by absorbing water in air at normal temperature in addition to UV curing.

Figure 4:
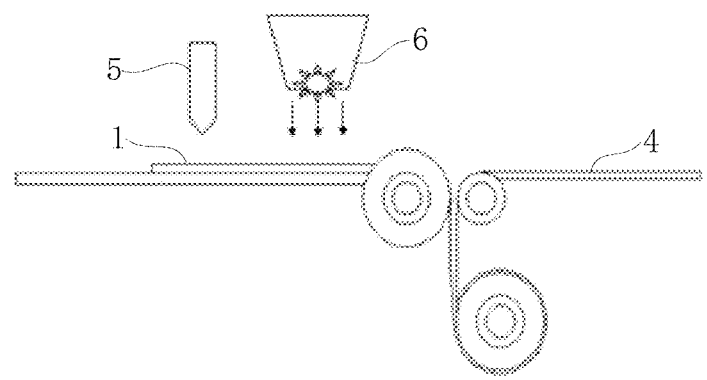
FIG. 4 is a schematic diagram of a preparation process of an optical clear adhesive provided by an embodiment of the present disclosure.

Exemplarily, as shown in FIG. 4, the surface of the substrate layer 1 may be coated with the adhesive composition by continuous coating of juxtaposed jets 5, and the adhesive composition is enabled to be subjected to partial polymerization by using the low-voltage lamp 6 in a way such as UV curing or thermal curing, the release liner 4 is attached to a rolling stage, and the adhesive composition on the other layer is coated in the same way.

In some embodiments, each of the first adhesive material structure 2, the second adhesive material structure 3 and the substrate layer 1 has the transmittance being greater than 93% and the haze being smaller than 1%.

Figure 5:
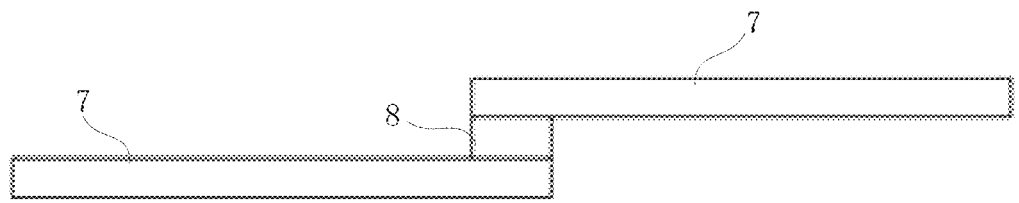
FIG. 5 is a schematic structural diagram of a sample for performance test of an adhesive material layer in an optical clear adhesive provided by an embodiment of the present disclosure.

Specifically, the performance of each layer of structure in the optical clear adhesive in the embodiment of the present disclosure may be tested by adopting the following method: for the adhesive material layers, firstly, a test sample is required to be prepared: a PET film of which the surface is treated (plasma) is prepared into a PET film 7 with the length being 100 mm and the width being 20 mm, a to-be-tested adhesive material layer is prepared into an adhesive material film 8 with the length being 20 mm and the width being 20 mm, the adhesive material film 8 is stuck to the surface of the PET film 7, and both the upper and lower surfaces of the adhesive material film 8 are stuck to the PET film 7 so as to form the test sample as shown in FIG. 5. The substrate layer 1 may be directly cut into a sample with a proper size so as to be subjected to performance test.

Test equipment: high-temperature universal material testing machine.

With a test process of an adhesive material layer as an example, a test program may be set as follows (test temperature: 85° C.):

a load is increased to a set value at the rate of 1 N/s, and the length of the test sample is changed from S0 to S1;

the load is fixed at the set value for 2 hr, and the length of the test sample is changed from S1 to S2;

the load is removed at the rate of 3N/s, and the length of the test sample is changed from S2 to S3; and after the load is removed, the variation of displacement within 10 min is tested, and the length of the test sample is changed from S3 to S4.

Figure 6:
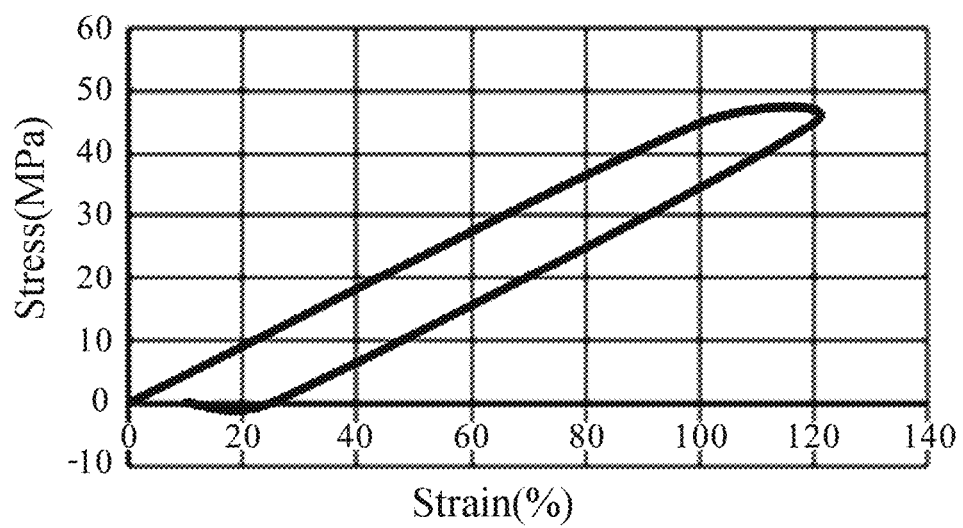
FIG. 6 is a schematic diagram of a curve that the tensile stress of the adhesive material layer in the optical clear adhesive provided by the embodiment of the present disclosure is changed with a strain rate.
Figure 7:
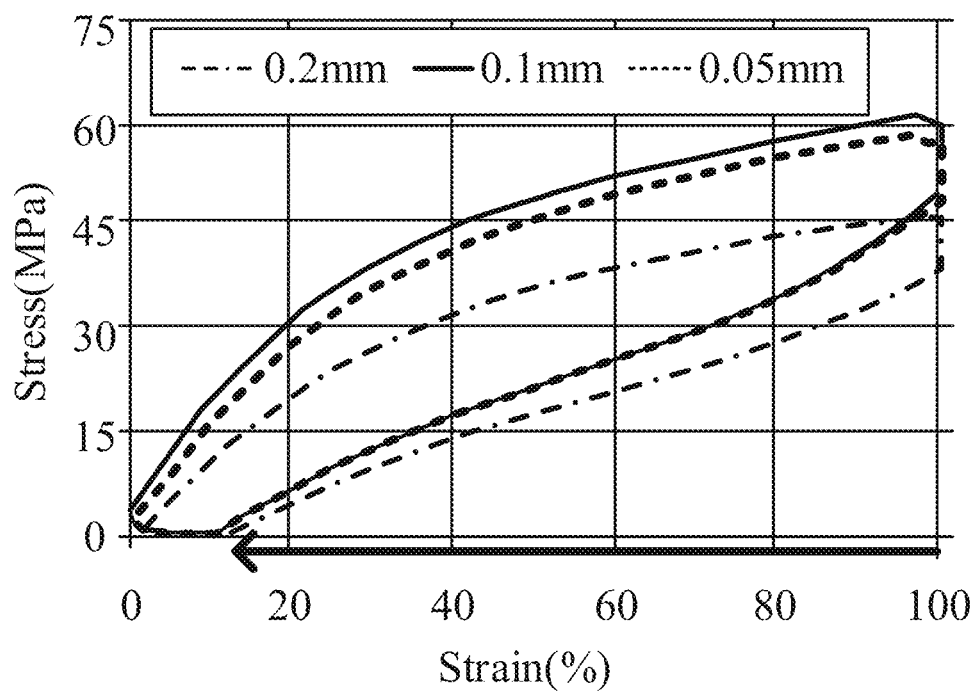
FIG. 7 is a schematic diagram of a curve that the tensile stress of a substrate layer in the optical clear adhesive provided by the embodiment of the present disclosure is changed with a strain rate.

FIG. 6 and FIG. 7 are respectively performance test results of an adhesive material layer and a substrate layer provided by the embodiment of the present disclosure. Specifically, FIG. 6 is a schematic diagram of a curve that a tensile stress (Stress) of the adhesive material layer is changed with a strain rate (Strain); FIG. 7 is a schematic diagram of a curve that a tensile stress (Stress) of the substrate layer is changed with a strain rate (Strain), where curves with different gray levels represent for curves that tensile stresses of the substrate layers with different thicknesses (the corresponding thicknesses as shown in FIG. 7 are respectively 0.2 mm, 0.1 mm and 0.05 mm) are changed with strain rates; and specifically, the set values of the loads in the test programs of the substrate layer and the adhesive material layers are different, the set values of the loads corresponding to the substrate layers with the different thicknesses are also different, and the set values of the loads are specifically set based on the standard that the strain rates may reach 100% (namely S2=2*S0).

It may be seen from the changing curve in FIG. 6 that a linear relationship is formed between the tensile stresses and tensile rates of the adhesive material layers, the deformability of the adhesive material layers is better, the deformation of the adhesive material layers is quick to recover with the removal of the loads, and the strain rates of the adhesive material layers may be basically recovered to about 10% after the loads are removed. It may be seen from the changing curve in FIG. 7 that the deformation of the substrate layers is also very quick to recover with the removal of the loads, and the strain rates of the substrate layers with various thicknesses may be basically recovered to about 4% after the loads are removed, the deformability of the substrate layers is very good, and specifically, calculated by adopting a formula (S2−S4) /S2*100%, wherein S2=2*S0, and (S4−S0)/S0*100%=4%, the deformation recovery rates of the substrate layers may reach about 98%.

Figure 8:
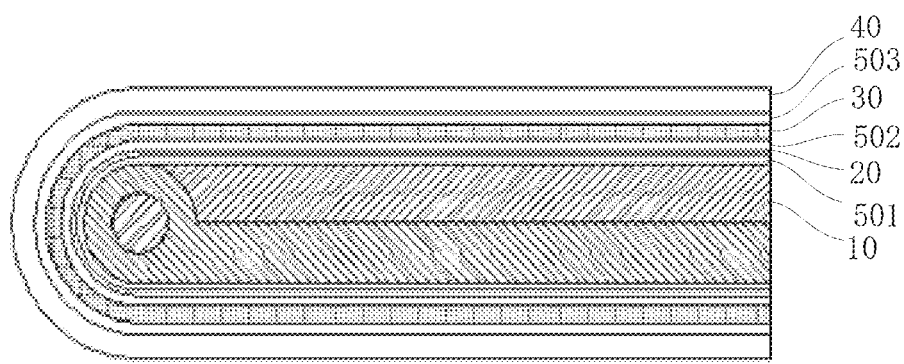
FIG. 8 is a schematic structural diagram of a display device provided by an embodiment of the present disclosure.

As shown in FIG. 8, an embodiment of the present disclosure further provides a display device including an OLED flexible display panel 10 and any one of the above-mentioned optical clear adhesives such as structural layers of optical clear adhesives 501, 502 and 503 in FIG. 8. The flexible display panel 10 includes at least one plane area and at least one foldable area, and the flexible display panel has two opposite sides. The optical clear adhesive disposed on at least one of the two opposite sides of the flexible display panel, and in each optical clear adhesive, a first adhesive material structure is close to an inner folding side (namely a side with folded face-to-face parts) of the display device, and a second adhesive material structure is close to an outer folding side (namely a side with folded back-to-back parts) of the display device.

In some embodiments, the display device provided by the embodiment of the present disclosure further includes at least one functional layer such as structural layers 20, 30 and 40 in FIG. 8; and the optical clear adhesive is arranged between any two structural layers of the display panel 10 and at least one functional layers, i.e., between the display panel 10 and an adjacent functional layer, and between functional layers.

Exemplarily, the at least one functional layer may include one or several of an optical film, a touch structure and a cover window, where the optical film may include a polarizer, and the cover window may be a cover film or cover glass.

Exemplarily, as shown in FIG. 8, the display device provided by the embodiment of the present disclosure includes a polarizer 20, a touch structure 30 and a cover window 40 sequentially arranged on the OLED flexible display panel 10.

In some embodiments, any two adjacent components in the OLED flexible display panel 10, the polarizer 20, the touch structure 30 and the cover window 40 may be adhered by adopting the optical clear adhesive provided by the embodiment of the present disclosure, as shown in FIG. 8, the OLED flexible display panel 10 and the polarizer 20 are adhered by adopting the optical clear adhesive 501, the polarizer 20 and the touch structure 30 are adhered by adopting the optical clear adhesive 502, and the touch structure 30 and the cover window 40 are adhered by adopting the optical clear adhesive 503.

The flexible display device is generally constructed to have the bending radius ranging from 3 mm to 10 mm, and in a folding and unfolding process of the flexible display panel, strains of the flexible display panel and external components (including functional layers and optical clear adhesive layers) are generated by any of pressure stress and tensile stress. In external components of a folding display device, the optical clear adhesive serving as a stress control component is generally constructed to partially decouple the stress of the flexible display panel and the stress of a flexible external component when the flexible display device is bent.

In the optical clear adhesive provided by the embodiment of the present disclosure, the substrate layer has relatively high strain rate and deformation recovery rate; the first adhesive material structure is relatively low in modulus and relatively high in tensile properties and is located on an outer layer of a bending area so as to be capable of providing a certain tensile deformation to reduce a bending stress; the second adhesive material structure is relatively high in modulus and resilience and is located on an inner layer of the bending area so as to be capable of improving the elastic resilience to reduce folds and buckling problems generated in a bending process; and when the optical clear adhesive is applied to the folding display device, the stress between the flexible display panel and each of the external components may be better decoupled, and the optical clear adhesive has a very good effect on improving the bending performance of the overall folding display device.

Obviously, the skilled in the art can make various alterations and variations on the embodiments of the present disclosure without departing from the spirit and scope of the present disclosure. In this way, if these alterations and variations of the present disclosure fall within the scopes of the claims and the equivalent technologies of the present disclosure, the present disclosure is also intended to include the alterations and variations.

The invention claimed is:

1. A display device, comprising:
a flexible display panel comprising at least one plane area and at least one foldable area;
wherein the flexible display panel has two opposite sides; and
an optical clear adhesive disposed on at least one of the two opposite sides of the flexible display panel, wherein:
the optical clear adhesive comprises:
a substrate layer, a first adhesive material structure and a second adhesive material structure respectively disposed on two opposite sides of the substrate layer;
wherein all the substrate layer, the first adhesive material structure and the second adhesive material structure are transparent materials;
a deformation recovery rate of the substrate layer is greater than that of each of the first adhesive material structure and the second adhesive material structure; and
in the optical clear adhesive, the deformation recovery rate of the second adhesive material structure is greater than that of the first adhesive material structure, the second adhesive material structure is closer to an inner folding side of the foldable area of a display panel, and the first adhesive material structure is closer to an outer folding side of the foldable area of the display panel;
wherein
the first adhesive material structure comprises at least two adhesive material layers, wherein the at least two adhesive material layers are in direct contact; in the first adhesive material structure, the closer the adhesive material layer is to the substrate layer, the greater a storage modulus of the adhesive material layer is;
and/or
the second adhesive material structure comprises at least two adhesive material layers, wherein the at least two adhesive material layers are in direct contact and in the second adhesive material structure, the closer the adhesive material layer is to the substrate layer, the greater a storage modulus of the adhesive material layer is.

2. The display device according to claim 1, further comprising at least one functional layer; wherein the optical clear adhesive is disposed between any adjacent two of the display panel and the at least one functional layer.

3. The display device according to claim 2, wherein the at least one functional layer comprises one or several of an optical film, a touch structure and a cover window.

4. The display device according to claim 1, wherein the deformation recovery rate of the first adhesive material structure is greater than 80%; the deformation recovery rate of the second adhesive material structure is greater than 90%; and
the deformation recovery rate of the substrate layer is greater than 95%.

5. The display device according to claim 1, wherein a storage modulus of the second adhesive material structure is greater than that of the first adhesive material structure.

6. The display device according to claim 5, wherein the storage modulus of the first adhesive material structure is 20 KPa-50 KPa; and the storage modulus of the second adhesive material structure is 50 KPa-100 KPa.

7. The display device according to claim 1, wherein each of the first adhesive material structure and the second adhesive material structure comprises an adhesive material layer.

8. The display device according to claim 1, wherein the storage modulus of each adhesive material layer in the first adhesive material structure is greater than that of each adhesive material layer in the second adhesive material structure.

9. The display device according to claim 1, wherein glass transition temperatures of the first adhesive material structure and the second adhesive material structure are lower than 30° C. below zero.

10. The display device according to claim 1, wherein viscosities of the first adhesive material structure and the second adhesive material structure are 1500-3000 gf/inch.

11. The display device according to claim 1, wherein a Young modulus of the substrate layer is 2 GPa-10 GPa.

12. The display device according to claim 1, wherein a material of the substrate layer comprises polyethylene terephthalate, polyimide, polyurethane,_ and silicon.

13. The display device according to claim 1, wherein
a thickness of the first adhesive material structure is 2 μm-30 μm;
a thickness of the second adhesive material structure is 2 μm-100 μm; and
a thickness of the substrate layer is 5 μm-100 μm.

14. An optical clear adhesive, comprising:
a substrate layer; and
a first adhesive material structure and a second adhesive material structure respectively disposed on two opposite sides of the substrate layer;
wherein all the substrate layer, the first adhesive material structure and the second adhesive material structure are transparent materials;
a deformation recovery rate of the substrate layer being greater than that of each of the first adhesive material structure and the second adhesive material structure, and the deformation recovery rate of the second adhesive material structure is greater than that of the first adhesive material structure;
wherein
the first adhesive material structure comprises at least two adhesive material layers, wherein the at least two adhesive material layers are in direct contact; in the first adhesive material structure, the closer the adhesive material layer is to the substrate layer, the greater a storage modulus of the adhesive material layer is;
and/or
the second adhesive material structure comprises at least two adhesive material layers, wherein the at least two adhesive material layers are in direct contact and in the second adhesive material structure, the closer the adhesive material layer is to the substrate layer, the greater a storage modulus of the adhesive material layer is.

15. The optical clear adhesive according to claim 14, wherein the deformation recovery rate of the first adhesive material structure is greater than 80%; the deformation recovery rate of the second adhesive material structure is greater than 90%; and the deformation recovery rate of the substrate layer is greater than 95%.

16. The optical clear adhesive according to claim 14, wherein a storage modulus of the second adhesive material structure is greater than that of the first adhesive material structure.

\* \* \* \* \*